United States Patent [19]

Aoyama et al.

[11] Patent Number: 4,504,743
[45] Date of Patent: Mar. 12, 1985

[54] SEMICONDUCTOR RESISTOR ELEMENT

[75] Inventors: Keizo Aoyama, Yamato; Takahiko Yamauchi, Kawasaki, both of Japan

[73] Assignee: Fujitsu Limited, Kawasaki, Japan

[21] Appl. No.: 326,125

[22] Filed: Nov. 30, 1981

[51] Int. Cl.$^3$ .......................... H03K 3/26; H03K 3/01
[52] U.S. Cl. ................................ 307/310; 307/296 R; 307/571; 357/22
[58] Field of Search .................. 307/310, 296 R, 571, 307/581; 357/22, 28

[56] References Cited

U.S. PATENT DOCUMENTS

| | | | |
|---|---|---|---|
| 3,056,100 | 9/1962 | Warner, Jr. | 357/22 |
| 3,436,689 | 4/1969 | Fluhr | 307/605 |
| 4,260,911 | 4/1981 | Brown, Jr. et al. | 357/28 |
| 4,272,880 | 6/1981 | Pashley | 357/42 |

FOREIGN PATENT DOCUMENTS 50-68284  6/1975  Japan .

Primary Examiner—Stanley D. Miller
Assistant Examiner—B. P. Davis
Attorney, Agent, or Firm—Staas & Halsey

[57] ABSTRACT

A semiconductor resistor element comprising a semiconductor film which has a desired shape and electrode wirings at both ends thereof, and a control electrode provided between the two ends of the semiconductor film via an insulating film. The control electrode is served with a control voltage which controls the resistance of the semiconductor film. Namely, the control electrode is served with a control voltage that changes with the change in temperature to offset the change in resistance of the semi-conductor film caused by the change in temperature.

1 Claim, 7 Drawing Figures

SEMICONDUCTOR RESISTOR ELEMENT

BACKGROUND OF THE INVENTION

1. Field of the Invention

The present invention relates to a semiconductor resistor element that can be suitably used as a load resistor for static memory cells.

2. Prior Art

Static random access memories necessitate load resistors for supplying electric charge to assure static property. The load resistors constitute a memory cell together with a flip-flop circuit formed by a pair of transistors and in the flip-flop circuit one of the transistors is usually conductive and the other one is nonconductive. The load resistors supply a current to render the transistors conductive or nonconductive, and also work to maintain the transistors conductive. To minimize the power consumption of memories, however, the resistors should have a high resistance.

In recent years, there have been proposed memory cells which feature a reduced power requirement. For example, a power-supply current which had so far been required on the order of 50 to 100 mA has now been reduced to 10 to 20 mA when the memory is in the stand-by mode. With the memory of this type, the flow of current is limited when the peripheral circuits are under the stand-by condition in order to reduce the consumption of electric power. However, it is also important to reduce the consumption of electric power by the memory cells. The effort to reduce the consumption of power by the peripheral circuits becomes meaningless if heavy current flows through the memory cells. In particular, the number of memory cells increases with the increase in the memory capacity, while the peripheral circuits are not so increased. It is, therefore, important to construct memory cells which consume less electric power.

From the viewpoint of reducing the consumption of electric power and increasing the degree of integration, in recent years, a high-resistance polycrystalline silicon film has more often been used as the load. This is disclosed, for example, in U.S. Patent specification No. 4,110,776. This silicon film exhibits a greatly varying resistance depending upon the concentration of impurities; a high resistance can be easily obtained if the concentration of impurities is decreased. The concentration of impurities can be easily and accurately adjusted by ion implantation. However, the resistance of a polycrystalline silicon resistor has a very great temperature gradient. At an ordinary temperature, for example, the electric current per cell will be from 1 to 100 nA. At high temperatures, however, the current increases by about ten times, i.e., the current of 10 to 1000 nA flows. This presents a serious problem when the memory has large capacities. If it is attempted to increase the load resistance such that the consumption of electric power remains sufficiently small even at high temperatures, the operation becomes defective at an ordinary temperature. For instance, the operation of the flip-flop circuit becomes slow, and it becomes difficult to sufficiently supply a leakage current across the source and drain of the transistor. Accordingly, the potential at the node changes, and it becomes impossible to maintain the transistors conductive or nonconductive.

OBJECTS AND SUMMARY OF THE INVENTION

An object of the present invention is to provide a semiconductor resistor element which controls the value of resistance of a high-resistance film by utilizing the change of the electric field in which the high-resistance film is placed.

Another object of the present invention is to provide a semiconductor resistor element which cancels the value in resistance of a high-resistance film caused by the change in temperature.

According to the present invention, the above objects can be achieved by a semiconductor resistor element in which wirings are provided at both ends of a semiconductor film having a desired shape, a control electrode is provided on the semiconductor film between both ends via an insulating film, and a control voltage is applied to the control electrode to control the resistance of the semiconductor film.

Further features and advantages of the present invention will become apparent from the ensuing description with reference to the accompanying drawings to which, however, the scope of the invention is in no way limited.

DESCRIPTION OF THE PREFERRED EMBODIMENT

Figure 1:
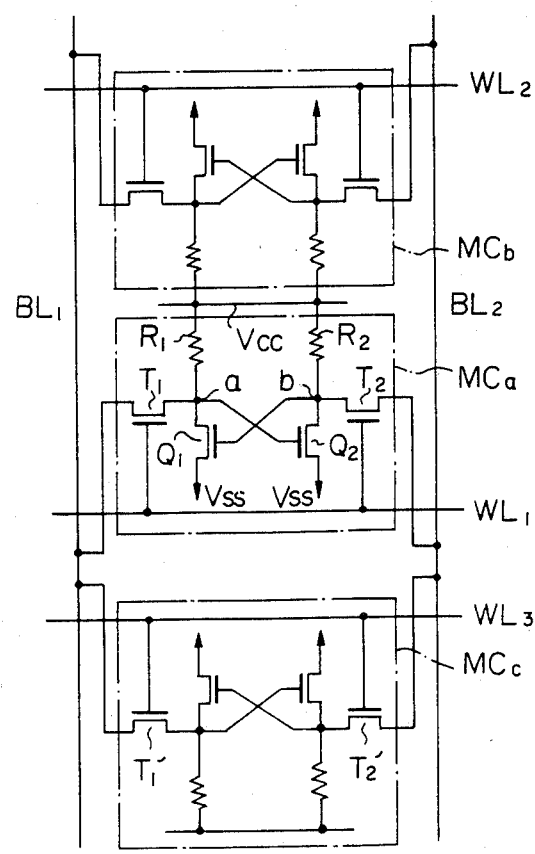
FIG. 1 is a circuit diagram of a static memory cell.

FIG. 1 schematically illustrates a static RAM cell, in which $WL_1$, $WL_2$, ... denote word lines, $BL_1$ and $BL_2$ denote bit lines, and MCa, MCb, ... denote memory cells that are connected to intersecting points of the word lines and bit lines. Each memory cell consists of load resistors $R_1$, $R_2$, driving transistors $Q_1$, $Q_2$, and transistors $T_1$, $T_2$ for a transfer gate. Symbol $V_{cc}$ denotes a high potential level side of the power supply, and $V_{ss}$ denotes a low potential level side. The transistors $Q_1$ and $Q_2$ constitute a flip-flop circuit, together with the resistors $R_1$ and $R_2$, and one of them is always conductive and the other one is nonconductive. The load resistors $R_1$ and $R_2$ work to supply power to render the transistors conductive or nonconductive, and to maintain the transistors conductive. From the standpoint of reducing the consumption of power by the memory, however, the load resistors should have a resistance as high as possible. In recent years, there have been proposed memory cells which feature a reduced power requirement. For example, a power-supply current which had so far been required on the order of 50 to 100 mA has now been reduced to 10 to 20 mA when the memory is in the stand-by mode. With the memory of this type, the flow of current is limited when the peripheral circuits are under the stand-by condition in order to reduce the consumption of electric power. However, it is also important to reduce the consumption of electric power by the memory cells. The effort to reduce the consumption of power by the peripheral circuits becomes meaningless if a heavy current flows through the memory cells. In particular, the number of memory cells increase with the increase in the memory capacity, while the peripheral circuits are not so increased. It is, therefore, important to construct memory cells which consume less electric power.

Figure 2:
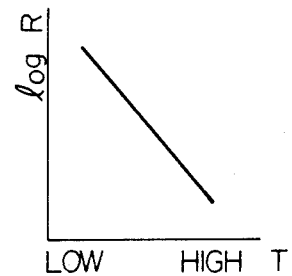
FIG. 2 is a graph showing the change in resistance of a polycrystalline silicon semiconductor resistor relative to the change in temperature, which is used for the static memory cell of FIG. 1.

A polycrystalline silicon film is suited as a high-resistance load resistor for the memory cells. This silicon film exhibits a greatly varying resistance depending upon the concentration of impurities; a high resistance can be easily obtained if the concentration of impurities is decreased. The concentration of impurities can be easily and accurately adjusted by ion implantation. However, the resistance of a polycrystalline silicon film changes greatly depending upon the temperature. In other words, referring to FIG. 2 in which the ordinate represents logarithmic values log R and the abscissa represents the temperature T, the resistance of the polycrystalline silicon film decreases nearly linearly. At an ordinary temperature, for exmple, the electric current per cell will be from 1 to 100 nA. At high temperatures, however, the current increases by about ten times, i.e., the current of 10 to 1000 nA flows. This presents a serious problem when the memory has large capacities. If it is attempted to increase the load resistance R such that the consumption of electric power remains sufficiently small even at high temperatures, the operation becomes defective at an ordinary temperature. For instance, the operation of the flip-flop circuit becomes slow, and it becomes difficult to sufficiently supply a leakage current across the source and drain of the transistor. Accordingly, the potential at the node changes, and it becomes impossible to render the transistors conductive or nonconductive.

Figure 3A:
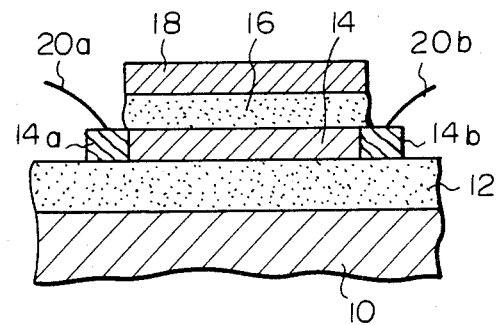
FIGS. 3A and 3B are a schematic section view and a plan view, respectively, of a semiconductor resistor element according to an embodiment of the present invention.
Figure 3B:
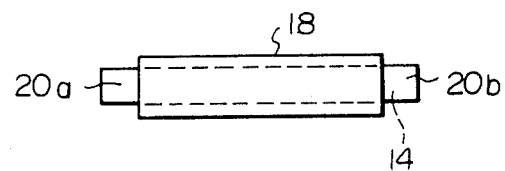

The present invention is to improve the above-mentioned defects. An embodiment of the invention is illustrated in FIGS. 3A and 3B. In FIG. 3A, reference numeral 10 denotes a silicon semiconductor substrate, 12 denotes an insulating film composed of silicon dioxide ($SiO_2$) or the like, 14 denotes a polycrystalline silicon film that serves as a resistor, 14a and 14b denote electrodes to which lead wires 20a, 20b will be connected, 16 denotes, a thin insulating film composed of silicon dioxide or the like, and 18 denotes a control electrode mounted on the thin insulating film. The control electrode 18 is composed of polycrystalline silicon, but may also be composed of aluminum or the like. FIG. 3B is a plan view showing the shapes of the electrode 18, the polycrystalline silicon film 14 and the lead wires 20a, 20b. The polycrystalline silicon film 14 is formed through the ordinary steps for forming the transistors. That is, silicon is vaporized onto the insulating film 12 by CVD method followed by the patterning to obtain a desired shape, and impurities are implanted to a desired concentration, in order to form the polycrystalline silicon film 14. As required, in this case, the concentration of impurities is increased in the portion of the electrodes 14a, 14b. In the silicon film 14, the electrode portions serve as a source and a drain, respectively, and the portion therebetween serves as a channel, thereby forming an element such as a MOS transistor with the electrode 18 serving as gate electrode. When the silicon film 14 is of the n-type, if a negative voltage is applied to the gate electrode 18, a depletion layer is formed in the channel portion and the resistance is increased. If the voltage is increased with the rise in temperature, the reduction of resistance of the silicon film that is caused by the rise in temperature is offset, whereby the resistance vs. temperature coefficient is decreased.

Figure 4:
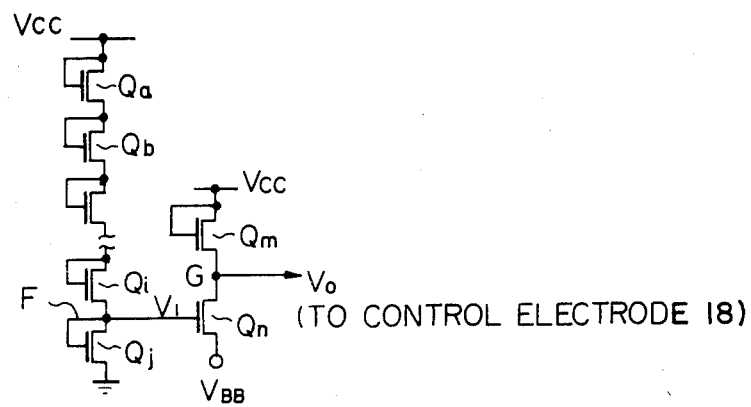
FIG. 4 illustrates a circuit for generating a control voltage that will be applied to the semiconductor element.

FIG. 4 illustrates a circuit which generates a voltage that will be applied to the control electrode 18. In FIG. 4, $Q_a$ through $Q_j$ denote MOS transistors that are connected in series between the power supply $V_{CC}$ and the ground; the drain and gate of each of the transistors are short-circuited, so that the transistors work as resistors. The transistors $Q_a$ through $Q_i$ have the same mutual conductance, but the transistor $Q_j$ has a small mutual conductance and works as a leakage resistor. Symbols $Q_m$ and $Q_n$ denote MOS transistors that are connected in series between the positive power supply $V_{CC}$ and the negative power supply $V_{BB}$, and that form an output stage of the circuit of FIG. 4. The transistor $Q_m$ serves as a resistor with its drain and gate being short-circuited, and the transistor $Q_n$ receives the control voltage through the gate thereof, the control voltage being fed from an output terminal F of the transistor of the input stage. A connection point G between the transistor $Q_m$ and the transistor $Q_n$ serves as an output terminal of the circuit, and produces a voltage $V_O$ that will be applied to the control electrode 18. Here, the circuit of FIG. 4 receives the same temperature as the semiconductor resistor element shown in FIGS. 3A and 3B.

Figure 5:
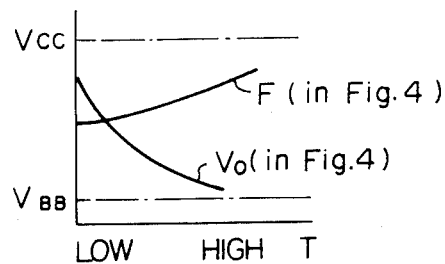
FIG. 5 is a diagram illustrating the operation of the control voltage generator circuit of FIG. 4.

The operation will be described below. The voltage $V_1$ at the point F becomes nearly equal to $V_{CC} - i \cdot Vth$, where i denotes the number of transistors $Q_a$ through $Q_i$, and Vth denotes a threshold voltage of the transistors. Upon receipt of the voltage $V_1$, the transistor $Q_n$ assumes a given conductivity, and produces at the output terminal G the voltage $V_O$ that is obtained by dividing the voltage $V_{CC} - (-V_{BB})$. FIG. 5 shows voltages at the points F and G of FIG. 4. The threshold voltage Vth of the transistors $Q_a$ through $Q_i$ decreases with the increase in ambient temperature, whereby the voltage $V_1$ increases, the conductivity of the transistor $Q_n$ increases, and the output voltage $V_O$ increases toward the negative side. The number of transistors $Q_a$ through $Q_i$ and the threshold voltage Vth are suitably adjusted, such that the voltage $V_O$ will offset the change in resistance of the semiconductor film 14 that is caused by the change in temperature.

Figure 6:
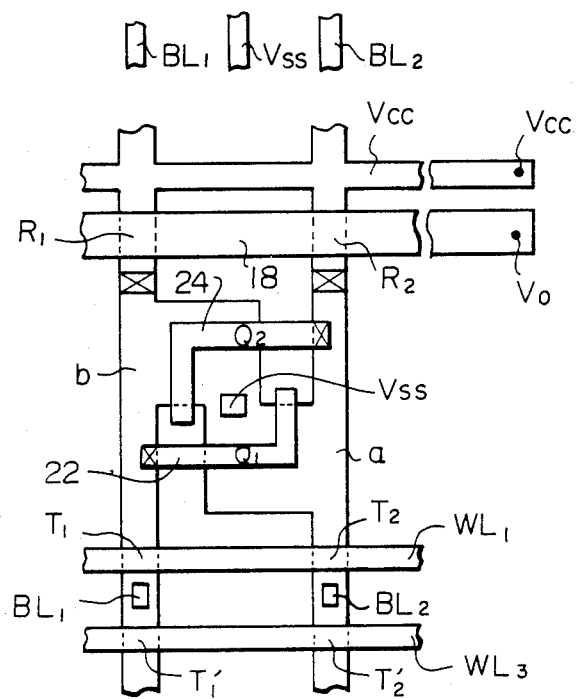
FIG. 6 is a plan view of a memory cell employing the semiconductor resistor element according to the present invention.

FIG. 6 illustrates an example in which the above semiconductor element is incorporated in a memory cell. In FIG. 6, the same reference numerals as those of FIG. 1 represent the same members as those of FIG. 1, and reference numerals 22, 24 denote gate electrodes of the transistors $Q_1$, $Q_2$. The drain region and the source region (denoted by a, b, $V_{SS}$) of the transistors $Q_1$, $Q_2$ extend on both sides of the gate electrodes 22, 24. The source and drain regions serve as so-called active regions surrounded by a field region on which is formed a thick insulating film. Reference numeral 18 denotes a wiring pattern ror the control electrode. The wiring pattern is connected to the output terminal $V_O$ of FIG. 4. Symbol x denotes the contacting portion.

According to the present invention as illustrated in the foregoing, it is possible to obtain a resistor which has a high resistance and a small resistance vs. temperature coefficient, and which is suited for use as a load resistor for static memory cells. The resistor of the present invention can be effectively used for LSI's. In addition to polycrystalline silicon, the semiconductor film may be composed of germanium (Ge) or gallium arsenide (GaAs). Further, when the resistor is to be used for the memory, the circuit of FIG. 4 may, of course, be formed in a portion of the chip on which are formed the memory cells, such that the circuit receives the same temperature.

We claim:

1. A semiconductor resistor element operatively connected to receive a control voltage, said resistor element comprising:

wirings being formed at both ends of a polycrystalline semiconductor film which is formed in a desired topological shape;

a control electrode, being provided on said polycrystalline semiconductor film between said two ends via an insulating film, operatively connected to receive said control voltage for controlling the resistance of said polycrystalline semiconductor film; and a circuit for generating said control voltage including MOS transistor $Q_a$ through $Q_j$ connected between a power supply and ground, the respective drains and gates being short-circuited, and transistors $Q_m$ and $Q_n$ connected in series between a positive power supply and a gegative power suppy, the transistors $Q_a$ through $Q_i$ have nearly the same mutual conductance, the transistor $Q_j$ has a small mutual conductance, the transistor $Q_m$ serves as a resistor with its drain and gate being short-circuited, the transistor $Q_n$ receives a voltage from a point at which the transistors $Q_i$ and $Q_j$ are connected together, and said control voltage is otained from a point at which the transistors $Q_m$ and $Q_n$ are connected together.

* * * * *

UNITED STATES PATENT AND TRADEMARK OFFICE
CERTIFICATE OF CORRECTION

PATENT NO. : 4,504,743

DATED : March 12, 1985

INVENTOR(S) : Aoyama et al.

It is certified that error appears in the above-identified patent and that said Letters Patent is hereby corrected as shown below:

Front page, U.S. Patent Documents "4,260,911 4/1981
        Brown, Jr. et al. 357/28" should be --4,260,911
        9/1981 Brown, Jr. et al. 357/28--.
    Column 3, line 61, delete "the".
    Column 4, line 62, "ror" should be --for--.
    Column 6, line 9, "gegative" should be --negative--;
             line 16, "otained" should be --obtained--.

Signed and Sealed this

*Tenth* Day of *September 1985*

[SEAL]

*Attest:*

DONALD J. QUIGG

*Attesting Officer*    *Acting Commissioner of Patents and Trademarks - Designate*

UNITED STATES PATENT AND TRADEMARK OFFICE
CERTIFICATE OF CORRECTION

PATENT NO.   : 4,504,743
DATED        : March 12, 1985
INVENTOR(S)  : AOYAMA ET AL.

It is certified that error appears in the above-identified patent and that said Letters Patent is hereby corrected as shown below:

Front Page, [30] Foreign Application Priority Data:
    insert --December 12, 1980 [JP] Japan ... 80-175358--.

Signed and Sealed this

Nineteenth Day of November 1985

[SEAL]

Attest:

Attesting Officer

DONALD J. QUIGG

Commissioner of Patents and Trademarks